(12) United States Patent
Tsukamoto et al.

(10) Patent No.: US 12,185,561 B2
(45) Date of Patent: Dec. 31, 2024

(54) DISPLAY DEVICE, DISPLAY DEVICE MANUFACTURING METHOD, DISPLAY DEVICE MANUFACTURING APPARATUS

(71) Applicant: SHARP KABUSHIKI KAISHA, Sakai (JP)

(72) Inventors: Yuto Tsukamoto, Sakai (JP); Tokiyoshi Umeda, Sakai (JP); Hiroshi Tsuchiya, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 770 days.

(21) Appl. No.: 17/259,330

(22) PCT Filed: Jul. 19, 2018

(86) PCT No.: PCT/JP2018/027136
§ 371 (c)(1),
(2) Date: Jan. 11, 2021

(87) PCT Pub. No.: WO2020/016998
PCT Pub. Date: Jan. 23, 2020

(65) Prior Publication Data
US 2021/0305533 A1  Sep. 30, 2021

(51) Int. Cl.
*H10K 50/15* (2023.01)
*H10K 50/11* (2023.01)
(Continued)

(52) U.S. Cl.
CPC ............. *H10K 50/15* (2023.02); *H10K 50/11* (2023.02); *H10K 59/353* (2023.02); *H10K 71/00* (2023.02); *H10K 2101/40* (2023.02)

(58) Field of Classification Search
CPC .......... H10K 50/15; H10K 59/14–147; H10K 59/10–121; H10K 50/14–157;
(Continued)

(56) References Cited

U.S. PATENT DOCUMENTS

2013/0313535 A1* 11/2013 Heo ................... H10K 71/60
438/46
2017/0250232 A1* 8/2017 Wang .................. H10K 50/125
(Continued)

FOREIGN PATENT DOCUMENTS

CN  106653803 A  5/2017
JP  2013157225 A  8/2013

*Primary Examiner* — Mary A Wilczewski
*Assistant Examiner* — Nathan Pridemore
(74) *Attorney, Agent, or Firm* — ScienBiziP, P.C.

(57) ABSTRACT

A display device includes a plurality of sub-pixels. The sub-pixels include, in common, a common hole-transport layer disposed between an anode and a light-emitting layer. Each sub-pixel individually includes an individual hole-transport layer disposed between the common hole-transport layer and the light-emitting layer. The common hole-transport layer is made of a first hole-transport-layer material. A sub-pixel has a first color and includes a first individual hole-transport layer made of a second hole-transport-layer material. A sub-pixel has a second color and includes a second individual hole-transport layer made of a mixed material of the first and second hole-transport-layer materials.

12 Claims, 4 Drawing Sheets

(51) Int. Cl.
*H10K 59/35* (2023.01)
*H10K 71/00* (2023.01)
*H10K 101/40* (2023.01)

(58) Field of Classification Search
CPC .... H10K 2101/40; H10K 50/11; H10K 71/00; H10K 59/353
See application file for complete search history.

(56) References Cited

U.S. PATENT DOCUMENTS

| | | | |
|---|---|---|---|
| 2017/0250361 A1* | 8/2017 | Wang | H10K 85/6572 |
| 2017/0330918 A1* | 11/2017 | Wang | H10K 85/633 |
| 2018/0151850 A1* | 5/2018 | Lee | H10K 59/30 |
| 2018/0175301 A1* | 6/2018 | Ookuma | H10K 85/636 |

* cited by examiner

DISPLAY DEVICE IN COMPARATIVE EXAMPLE

DISPLAY DEVICE, DISPLAY DEVICE MANUFACTURING METHOD, DISPLAY DEVICE MANUFACTURING APPARATUS

TECHNICAL FIELD

The disclosure relates to a display device that includes light-emitting elements.

BACKGROUND ART

Patent Literature 1 describes a display device that includes light-emitting elements with a hole-transport layer included in common in sub-pixels.

CITATION LIST

Patent Literature

Patent Literature 1: Japanese Patent Application Laid-Open No. 2013-157225

SUMMARY

Technical Problem

In the light-emitting elements in Patent Literature 1, a hole injected into a sub-pixel via the hole-transport layer, included in common in the sub-pixels, is transferred to another sub-pixel, thus causing crosstalk, which is lighting-on of an undriven sub-pixel.

Solution to Problem

To solve this problem, the disclosure provides a display device including the following: a plurality of sub-pixels that emit different colors of light from each other, and a stack of a light-emitting layer, an anode, and a cathode. The light-emitting layer is provided for each of the plurality of sub-pixels and emits a color of light corresponding to each of the plurality of sub-pixels. The anode is disposed on one side of the light-emitting layer. The cathode is disposed on another side of the light-emitting layer. The plurality of sub-pixels include, in common, a common hole-transport layer disposed between the anode and the light-emitting layer. Each of the plurality of sub-pixels individually includes an individual hole-transport layer disposed between the common hole-transport layer and the light-emitting layer. The common hole-transport layer is made of a first hole-transport-layer material. The plurality of sub-pixel include a sub-pixel having a first color and including a first individual hole-transport layer made of a second hole-transport-layer material different from the first hole-transport-layer material. The plurality of sub-pixel also include a sub-pixel having a second color and including a second individual hole-transport layer made of a mixed material of the first and second hole-transport-layer materials. The second color is different from the first color.

To solve the above problem, the disclosure provides a method for manufacturing a display device. The display device includes the following: a plurality of sub-pixels that emit different colors of light from each other; and a stack of a light-emitting layer, an anode, and a cathode. The light-emitting layer is provided for each of the plurality of sub-pixels and emits a color of light corresponding to each of the plurality of sub-pixels. The anode is disposed on one side of the light-emitting layer. The cathode is disposed on another side of the light-emitting layer. The method includes a hole-transport-layer forming step of forming a common hole-transport layer between the anode and the light-emitting layer in such a manner that the plurality of sub-pixels include, in common, the common hole-transport layer, and of forming an individual hole-transport layer between the common hole-transport layer and the light-emitting layer in such a manner that each of the plurality of sub-pixels individually includes the individual hole-transport layer. The hole-transport-layer forming step includes the following: forming the common hole-transport layer through evaporation of a first hole-transport-layer material; and forming, through evaporation of a second hole-transport-layer material, a first individual hole-transport layer in a sub-pixel having a first color and included in the plurality of sub-pixels. The second hole-transport-layer material is different from the first hole-transport-layer material. The step also includes forming, through co-evaporation of the first and second hole-transport-layer materials, a second individual hole-transport layer in a sub-pixel having a second color and included in the plurality of sub-pixels. The second color is different from the first color.

To solve the above problem, the disclosure provides an apparatus that manufactures a display device. The display device includes the following: a plurality of sub-pixels that emit different colors of light from each other; and a stack of a light-emitting layer, an anode, and a cathode. The light-emitting layer is provided for each of the plurality of sub-pixels and emits a color of light corresponding to each of the plurality of sub-pixels. The anode is disposed on one side of the light-emitting layer. The cathode is disposed on another side of the light-emitting layer. The apparatus includes an evaporation device that forms a common hole-transport layer between the anode and the light-emitting layer in such a manner that the plurality of sub-pixels include, in common, the common hole-transport layer, and forms an individual hole-transport layer between the common hole-transport layer and the light-emitting layer in such a manner that each of the plurality of sub-pixels individually includes the individual hole-transport layer. The evaporation device forms the common hole-transport layer through evaporation of a first hole-transport-layer material. The evaporation device also forms, through evaporation of a second hole-transport-layer material, a first individual hole-transport layer in a sub-pixel having a first color and included in the plurality of sub-pixels. The second hole-transport-layer material is different from the first hole-transport-layer material. The evaporation device also forms, through co-evaporation of the first and second hole-transport-layer materials, a second individual hole-transport layer in a sub-pixel having a second color and included in the plurality of sub-pixels. The second color is different from the first color.

The disclosure offers a display device with reduced crosstalk.

FIG. 1 schematically illustrates a display device according to a first embodiment of the disclosure in top and cross-sectional views.

FIG. 2 schematically illustrates a display device according to a comparative example in top and cross-sectional views.

DESCRIPTION OF EMBODIMENTS

First Embodiment

Figure 1:
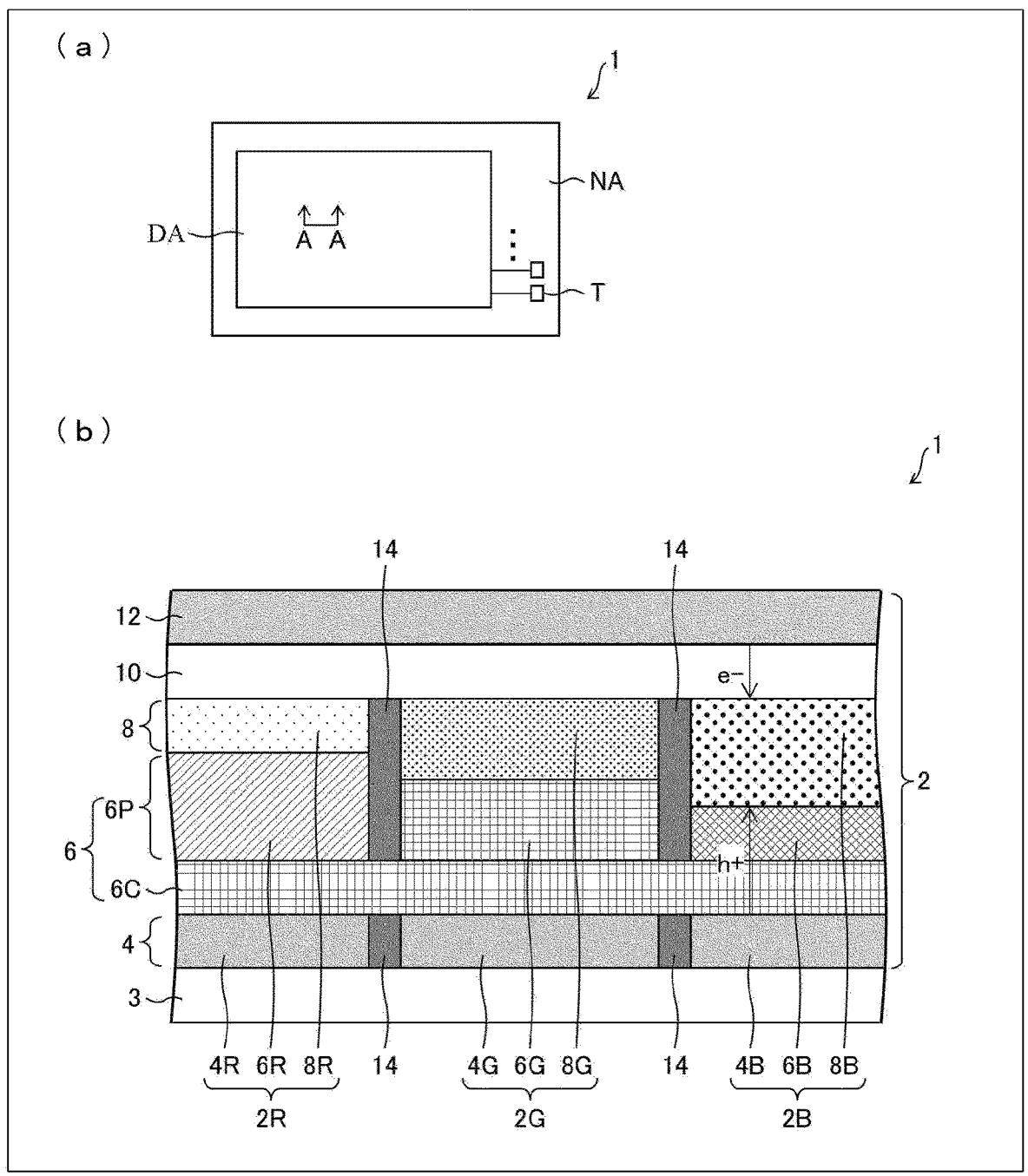

FIG. 1(a) is a schematic top view of a display device 1 according to this embodiment. FIG. 1(b) is a cross-sectional view taken along line A-A in FIG. 1(a).

As illustrated in FIG. 1(a), the display device 1 according to this embodiment includes a display region DA provided for display, and a frame region NA disposed around the display region DA. The frame region NA may include terminals T that receive a signal for driving light-emitting elements of the display device 1, which will be described later on.

In a location overlapping the display region DA in a plan view, the display device 1 according to this embodiment includes a light-emitting element layer 2 and an array substrate 3, as illustrated in FIG. 1(b). The display device 1 has a stack of layers of the light-emitting element layer 2 on the array substrate 3 provided with thin film transistors (TFTs) not shown. In the Description, a direction from the light-emitting element layer 2 to the array substrate 3 of the display device 1 will be defined as a downward direction; and a direction from the array substrate 3 to the light-emitting element layer 2 of the display device 1, an upward direction.

The light-emitting element layer 2 includes an anode 4 on which a hole-transport layer 6, a light-emitting layer 8, an electron-transport layer 10, and a cathode 12 are sequentially stacked from the bottom. The anode 4 of the light-emitting element layer 2, disposed on the array substrate 3, is electrically connected to the TFTs of the array substrate 3. In this embodiment, the hole-transport layer 6 includes a common hole-transport layer 6C and an individual hole-transport layer 6P.

The anode 4, the individual hole-transport layer 6P, and the light-emitting layer 8 are each separated by banks 14. In this embodiment in particular, the anode 4 is separated into a first anode 4R, a second anode 4G, and a third anode 4B by the banks 14. In addition, the individual hole-transport layer 6P is separated into a first hole-transport layer 6R (second or third individual hole-transport layer), a second hole-transport layer 6G (second or third individual hole-transport layer), and a third hole-transport layer 6B (first individual hole-transport layer) by the banks 14. Furthermore, the light-emitting layer 8 is separated into a first light-emitting layer 8R, a second light-emitting layer 8G, and a third light-emitting layer 8B by the banks 14. The common hole-transport layer 6C, the electron-transport layer 10, and the cathode 12 in contrast are not separated by the banks 14 and shared.

In this embodiment, the light-emitting element layer 2 includes a plurality of light-emitting elements: a first light-emitting element 2R, a second light-emitting element 2G, and a third light-emitting element 2B. The first light-emitting element 2R includes the first anode 4R, the common hole-transport layer 6C, the first hole-transport layer 6R, the first light-emitting layer 8R, the electron-transport layer 10, and the cathode 12. The second light-emitting element 2G includes the second anode 4G, the common hole-transport layer 6C, the second hole-transport layer 6G, the second light-emitting layer 8G, the electron-transport layer 10, and the cathode 12. The third light-emitting element 2B includes the third anode 4B, the common hole-transport layer 6C, the third hole-transport layer 6B, the third light-emitting layer 8B, the electron-transport layer 10, and the cathode 12. Each of the anode 4, the individual hole-transport layer 6P, and the light-emitting layer 8 is thus individually included in the first light-emitting element 2R, the second light-emitting element 2G, and the third light-emitting element 2B.

In this embodiment, the first light-emitting layer 8R, the second light-emitting layer 8G, and the third light-emitting layer 8B respectively emit red light, green light, and blue light. That is, the first light-emitting element 2R, the second light-emitting element 2G, and the third light-emitting element 2B are light-emitting elements that emit respective different colors, that is, red, green, and blue, of light from each other.

In other words, the first light-emitting element 2R, the second light-emitting element 2G, and the third light-emitting element 2B constitute a plurality of respective sub-pixels of red (second or third color), green (second or third color), and blue (first color) in the display device 1. Each of the red, green, and blue sub-pixels includes the light-emitting layer 8 that emits the corresponding color of light.

Here, blue light has a center emission wavelength in a wavelength band of 400 nm or more and 500 nm or less. In addition, green light has a center emission wavelength in a wavelength band of more than 500 nm and 600 nm or less. In addition, red light has a center emission wavelength in a wavelength band of more than 600 nm and 780 nm or less.

The anode 4 and the cathode 12 contain a conductive material, and are electrically connected to the common hole-transport layer 6C and the electron-transport layer 10, respectively. In this embodiment, the cathode 12, an electrode closer to the display surface of the display device 1 than the anode 4 is, is a semi-transparent electrode. The cathode 12 is formed using, for instance, ITO, IZO, AZO, or GZO and may be formed through sputtering or other methods. In this embodiment, the anode 4 contains a metal material. It is preferable that the metal material be, for instance, Al, Cu, Au, or Ag, which has high visible-light reflectivity.

The light-emitting layer 8 emits light through the rejoining together of holes transported from the anode 4 and electrons transported from the cathode 12. In this embodiment, the light-emitting layer 8 may be made of organic fluorescent material, phosphorescent material, semiconductor nanoparticle (quantum dot) material, or other materials.

The hole-transport layer 6 transports charges from the anode 4 to the light-emitting layer 8. The hole-transport layer 6 may be designed to hinder electron transport from the cathode 12. The common hole-transport layer 6C, the first hole-transport layer 6R, the second hole-transport layer 6G and the third hole-transport layer 6B of the hole-transport layer 6 are electrically connected to each other. The first hole-transport layer 6R, the second hole-transport layer 6G, and the third hole-transport layer 6B are electrically connected to the first light-emitting layer 8R, the second light-emitting layer 8G, and the third light-emitting layer 8B, respectively.

In this embodiment, the common hole-transport layer 6C is formed using a first hole-transport-layer material. In addition, the third hole-transport layer 6B, which constitutes a blue sub-pixel and is included in the third light-emitting element 2B, is formed using a second hole-transport-layer material different from the first hole-transport-layer material. Furthermore, the first hole-transport layer 6R, which constitutes a red sub-pixel and is included in the first light-emitting element 2R, is formed using a mixed material of the first and second hole-transport-layer materials. In addition, the second hole-transport layer 6G, which constitutes a green sub-pixel and is included in the second light-emitting element 2G, is formed using the same first hole-transport-layer material as the common hole-transport layer 6C. The first hole-transport layer 6R contains the second hole-transport-layer material at a mixture ratio of 10% or more and 50% or less of the whole first hole-transport layer 6R.

In this this embodiment, the energy level of the highest occupied molecular orbital, that is, the absolute value of HOMO, of the first hole-transport-layer material is smaller than the absolute value of HOMO of the second hole-transport-layer material. Let the HOMO absolute value of the first hole-transport-layer material be defined as HOMO1 (eV), and let the HOMO absolute value of the second hole-transport-layer material be defined as HOMO2 (eV). Accordingly, HOMO1+0.2 eV<HOMO2 ... (1) is established in this embodiment.

In this embodiment, the first hole-transport-layer material is α-NPD (HOMO: −5.40 eV) or TAPC (HOMO: −5.43 eV) for instance. In addition, the second hole-transport-layer material is TCTA (HOMO: −5.83 eV), mCP (HOMO: −5.90 eV), or mCBP (HOMO: −6.00 eV) for instance.

To efficiently transport holes from the anode to the light-emitting layer, the common hole-transport layer 6C in this embodiment is preferably formed using the first hole-transport-layer material with high hole mobility. It is common that the HOMO absolute value of the material contained in the third light-emitting layer 8B, which emits blue light, is larger than the HOMO absolute value of the material contained in the first light-emitting layer 8R, which emits red light, and the HOMO absolute value of the material contained in the second light-emitting layer 8G, which emits green light. To efficiently inject holes into the third hole-transport layer 6B, the third hole-transport layer 6B is hence preferably formed using the second hole-transport-layer material, which has a larger HOMO absolute value than the first hole-transport-layer material.

The electron-transport layer 10 transports electrons from the anode 12 to the light-emitting layer 8. The electron-transport layer 10 may be designed to hinder hole transport from the anode 4.

The hole-transport layer 6, the light-emitting layer 8, and the electron-transport layer 10 may be formed through a previously publicly known method, and may be formed through, for instance, evaporation using an evaporation mask. In this embodiment in particular, the common hole-transport layer 6C and the second hole-transport layer 6G are formed through evaporation of the first hole-transport-layer material, and the third hole-transport layer 6B is formed through evaporation of the second hole-transport-layer material. In this embodiment, the first hole-transport layer 6R is formed through co-evaporation of the first and second hole-transport-layer materials.

In this embodiment, the display device 1 may include a hole-injection layer and an electron-injection layer that are disposed between the anode 4 and the hole-transport layer 6 and between the cathode 12 and the electron-transport layer 10, and help charge injection from the electrodes to the charge-transport layer. The hole-injection layer and the electron-injection layer may be formed using the same method as the hole-transport layer 6 and the electron-transport layer 10.

In this embodiment, the thickness of the individual hole-transport layer 6P and the thickness of the light-emitting layer 8 may be different between the light-emitting elements. In this embodiment for instance, film thickness decreases in the order of the first hole-transport layer 6R, the second hole-transport layer 6G, and the third hole-transport layer 6B, as illustrated in FIG. 1(b) for instance. This enables the distance between the light-emitting layer 8 and the anode 4, which is a reflective electrode, to be regulated for each sub-pixel, offering an optical setting suitable for each sub-pixel.

For easy illustration. FIG. 1(b) shows that the total thickness of the individual hole-transport layer 6P and light-emitting layer 8 is all the same between the first light-emitting element 2R, the second light-emitting element 2G, and the third light-emitting element 2B. In addition, FIGS. 2, 4, 5, and 6, described later on, show that the total thickness of the individual hole-transport layer 6P and light-emitting layer 8 is all the same between these light-emitting elements.

In this embodiment, film thickness increases in the order of the first light-emitting layer 8R, the second light-emitting layer 8G, and the third light-emitting layer 8B, as illustrated in FIG. 1(b). In this embodiment, the total thickness of the individual hole-transport layer 6P and light-emitting layer 8 may be substantially constant between the light-emitting elements, as illustrated in FIG. 1(b). In some embodiments, the total thickness of the individual hole-transport layer 6P and light-emitting layer 8 may be different between the light-emitting elements unless causing any problems in forming the common electron-transport layer 10 onto the light-emitting layer 8.

Figure 2:
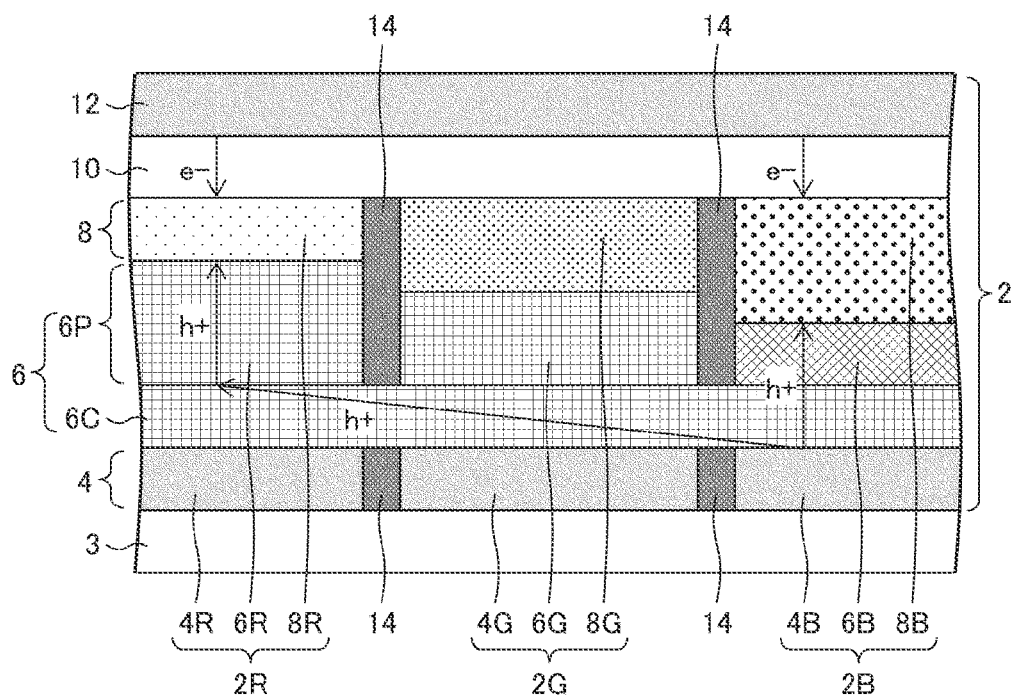

FIG. 2 is a cross-sectional view of a display device according to a comparative example and corresponds to FIG. 1(b). The display device according to the comparative example has a configuration different from that of the display device 1 according to this embodiment only in that the material of the first hole-transport layer 6R is different. The first hole-transport layer 6R in the comparative example is formed using the first hole-transport-layer material, like the common hole-transport layer 6C of the display device 1 according to this embodiment.

Figure 3:
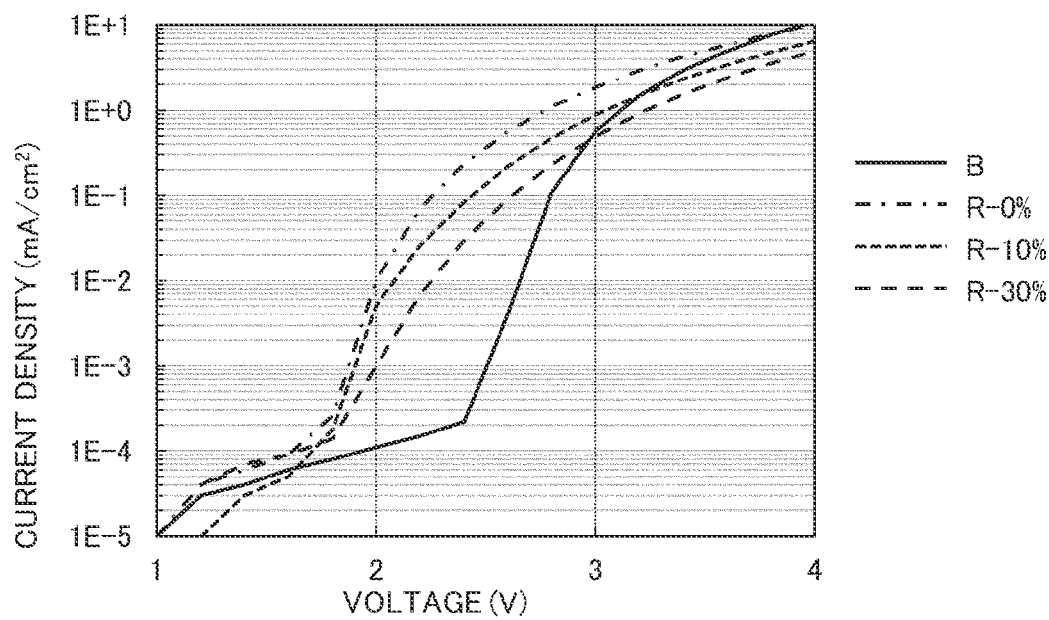
FIG. 3 is a graph showing the relationship between voltage applied across a light-emitting element of the display devices according to the first embodiment of the disclosure and to the comparative example and the density of current flowing through the light-emitting element.

FIG. 3 is a graph showing the relationship between voltage applied across a light-emitting element of a display device and the density of current flowing through the light-emitting element. In FIG. 3, the lateral axis represents voltage (V) applied across one light-emitting element included in a sub-pixel of the display device, and the longitudinal axis represents the density of current (mA/cm$^2$) flowing through the light-emitting element applied with the voltage.

Graph B in FIG. 3, denoted by a solid line, relates to this embodiment and the comparative example, and shows voltage applied across the third light-emitting element 2B and the density of current flowing through the third light-emitting element 2B applied with the voltage. Graph R-0% in FIG. 3, denoted by a dash-dotted line, relates to the comparative example and shows voltage applied across the first light-emitting element 2R and the density of current flowing through the first light-emitting element 2R applied with the voltage.

A light-emitting element that includes a red- or green-light-emitting layer typically has higher efficiency of charge injection than a light-emitting element that includes a bluelight-emitting layer, and thus has higher density of current flowing when the same voltage is applied. Reference is made to the comparative example. When 2 volts of voltage is applied across the first light-emitting element 2R and the third light-emitting element 2B, as illustrated in FIG. 3 for instance, the density of current flowing through the first light-emitting element 2R is about 100 times larger than the density of current flowing through the third light-emitting element 2B.

For this reason, when the light-emitting element 2B is driven, holes injected from the third anode 4B into the common hole-transport layer 6C can reach the first hole-transport layer 6R via the common hole-transport layer 6C, which has high hole mobility, as denoted by Arrow h+, which represents hole movement, in FIG. 2. The first hole-transport layer 6R in the comparative example is formed using the same first hole-transport-layer material as the common hole-transport layer 6C, which has high hole mobility.

Holes from the third anode 4B accordingly rejoin electrons from the cathode 12, which is a common electrode, in the first light-emitting layer 8R via the common hole-transport layer 6C and the first hole-transport layer 6R, thus possibly causing the first light-emitting element 2R to emit light. The comparative example can hence involve crosstalk, where light is emitted not from the driven, third light-emitting element 2B but from the first light-emitting element 2R.

Graph R-10% in FIG. 3, denoted by a dotted line, and Graph R-30% in FIG. 3, denoted by a dashed line, relate to this embodiment and shows voltage applied across the first light-emitting element 2R and the density of current flowing through the first light-emitting element 2R applied with the voltage. Here, Graph R-10% addresses that the first hole-transport layer 6R of the first light-emitting element 2R contains the second hole-transport-layer material at 10% of the whole, and Graph R-30% addresses that the first hole-transport layer 6R contains the second hole-transport-layer material at 30% of the whole.

When the first hole-transport layer 6R in this embodiment contains the second hole-transport-layer material at 10% of the whole, the density of current flowing through the first light-emitting element 2R applied with 2 volts of voltage is reduced by about half of the density of current flowing through the first light-emitting element 2R in the comparative example.

That is, the difference in how easily current flows between the first light-emitting element 2R and the third light-emitting element 2B is smaller in this embodiment than that in the comparative example. This is because that the first hole-transport layer 6R in this embodiment contains a certain amount of the second hole-transport-layer material and thus has a smaller level of hole mobility than the first hole-transport layer 6R in the comparative example.

This embodiment thus enables the first light-emitting element 2R, through which current easily flows via the common hole-transport layer 6C and the first hole-transport layer 6R, to be less likely to be driven upon voltage application across the third light-emitting element 2B. That is, the display device 1 according to this embodiment can reduce crosstalk from the blue sub-pixel to the red sub-pixel. This effect is particularly found when the common hole-transport layer 6C is made of material having high hole mobility.

When the first hole-transport layer 6R in this embodiment contains the second hole-transport-layer material at 30% of the whole, the density of current flowing through the first light-emitting element 2R applied with 2 volts of voltage is reduced by about a tenth of the density of current flowing through the first light-emitting element 2R in the comparative example. That is, the difference in how easily current flows between the first light-emitting element 2R and the third light-emitting element 2B is further smaller in this embodiment than that in the comparative example.

Thus in this embodiment, the first hole-transport layer 6R containing the second hole-transport-layer material at 30% of the whole can more efficiently reduce the aforementioned crosstalk than the first hole-transport layer 6R containing the second hole-transport-layer material at 10% of the whole.

This embodiment, which includes the first hole-transport layer 6R containing the second hole-transport-layer material at 10% or more of the whole, can achieve the aforementioned effect sufficiently. To improve the efficiency of hole injection in the first light-emitting element 2R, the first hole-transport layer 6R preferably contains the second hole-transport-layer material at only 50% or less of the whole.

That is, the luminance of the first light-emitting element 2R decreases along with increase in the content of the second hole-transport-layer material when the first hole-transport layer 6R contains the second hole-transport-layer material at more than 50% of the whole. Hence, setting the content of the second hole-transport-layer material within the first hole-transport layer 6R to 50% or less of the whole can easily offer the second light-emitting element 2R with high luminance while efficiently reducing the aforementioned crosstalk.

In this embodiment, the common hole-transport layer 6C may be made of only the first hole-transport-layer material, and the third hole-transport layer 6B may be likewise made of only the second hole-transport-layer material. This can further efficiently reduce the aforementioned effect.

In this embodiment, the HOMO absolute value of the first hole-transport-layer material is smaller than the HOMO absolute value of the second hole-transport-layer material, and Inequality (1) described above is established. This can efficiently reduce how easily current flows through the first light-emitting element 2R, thus further efficiently reducing the aforementioned crosstalk.

The display device 1 according to this embodiment requires no additional layer structure, unlike an existing display device. The display device 1 according to this embodiment can thus reduce an increase in total film thickness better than the existing display device. Moreover, the first hole-transport layer 6R is formed through co-evaporation of the first hole-transport-layer material, used for the common hole-transport layer 6C, and of the second hole-transport-layer material, used for the third hole-transport layer 6B. This eliminates the need for individually preparing a material for the first hole-transport layer 6R. The display device 1 according to this embodiment can be thus manufactured at reduced takt time and reduced cost.

Second Embodiment

Figure 4:
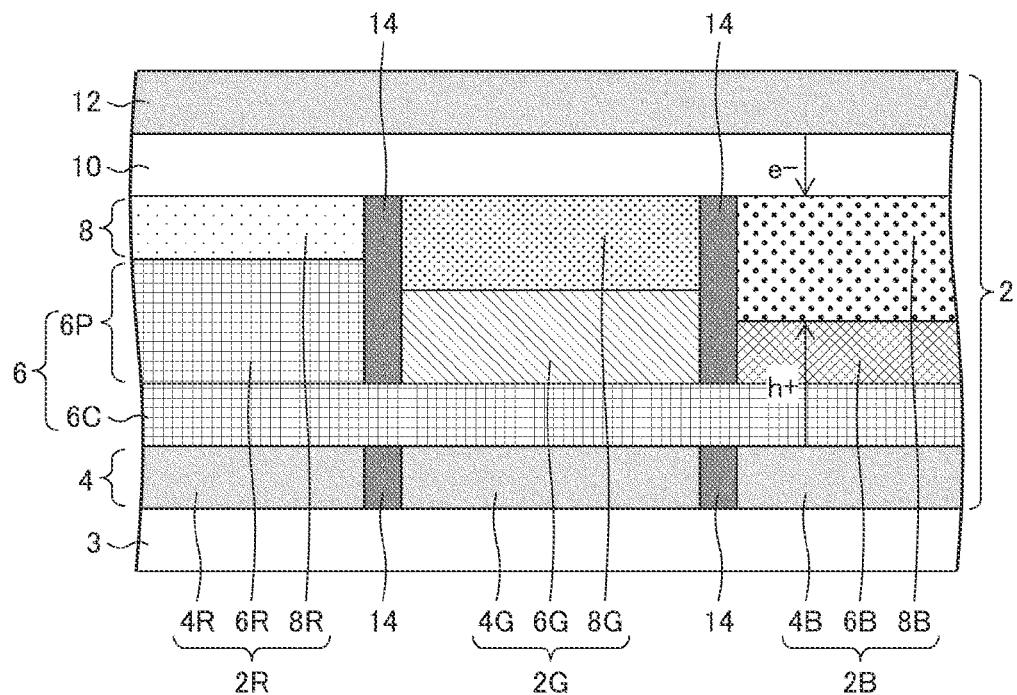
FIG. 4 is a schematic cross-sectional view of a display device according to a second embodiment of the disclosure.

FIG. 4 is a cross-sectional view of the display device 1 according to this embodiment and corresponds to FIG. 1(b). The display device 1 according to this embodiment has a configuration different from that of the display device 1 according to the foregoing embodiment only in that the materials of the first hole-transport layer 6R and second hole-transport layer 6G are different.

The first hole-transport layer 6R in this embodiment is formed using the first hole-transport-layer material, like the common hole-transport layer 6C. The second hole-transport layer 6G in contrast is formed using a mixed material of the first and second hole-transport-layer materials. The second hole-transport layer 6G contains the second hole-transport-layer material at a mixture ratio of 10% or more and 50% or less of the whole second hole-transport layer 6G.

That is, the second hole-transport layer 6G contains the second hole-transport-layer material at a mixture ratio of 10% or more and 50% or less, like the first hole-transport layer 6R in the first embodiment. This can easily offer the second light-emitting element 2G with high luminance while efficiently reducing crosstalk as earlier described.

The second hole-transport layer 6G containing the second hole-transport-layer material at 10% mixture ratio of the whole shows a characteristic between its current density and applied voltage similar to the characteristic illustrated in Graph R-10%. Likewise, the second hole-transport layer 6G containing the second hole-transport-layer material at 30% mixture ratio of the whole shows a characteristic between its current density and applied voltage similar to the characteristic illustrated in Graph R-30%.

Based on a principle similar to that described above, this embodiment can reduce charge movement to the second light-emitting element 2G, through which current easily flows via the common hole-transport layer 6C, upon voltage application across the third light-emitting element 2B. That is, the display device 1 according to this embodiment can reduce crosstalk from the blue sub-pixel to the green sub-pixel.

Third Embodiment

Figure 5:
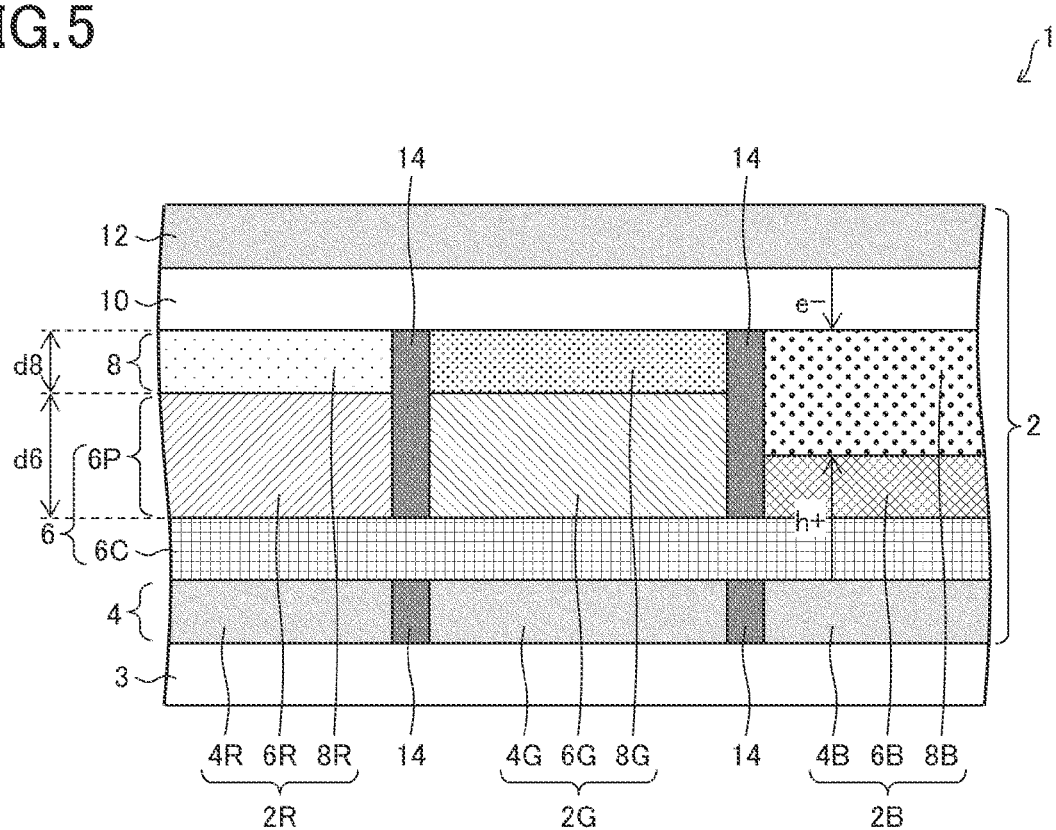
FIG. 5 is a schematic cross-sectional view of a display device according to a third embodiment of the disclosure.

FIG. 5 is a cross-sectional view of the display device 1 according to this embodiment and corresponds to FIG. 1(b). The display device 1 according to this embodiment is different from the display devices 1 according to the foregoing embodiments in the material of the first hole-transport layer 6R. The display device 1 according to this embodiment is also different from the display devices 1 according to the foregoing embodiments in the thicknesses of the first hole-transport layer 6R, second hole-transport layer 6G, first light-emitting layer 8R, and second light-emitting layer 8G. Other than the above exceptions, the display device 1 according to this embodiment has the same configuration as the display devices 1 according to the foregoing embodiments.

The first hole-transport layer 6R in this embodiment is formed using a mixed material of the first and second hole-transport-layer materials. The first hole-transport layer 6R contains the second hole-transport-layer material at a mixture ratio of 10% or more and 50% or less of the whole first hole-transport layer 6R.

In this embodiment, the first hole-transport layer 6R and the second hole-transport layer 6G have an identical thickness, and the first light-emitting layer 8R and the second light-emitting layer 8G have an identical thickness, as illustrated in FIG. 5. For instance, the first hole-transport layer 6R and the second hole-transport layer 6G may have an identical thickness d6, and the first light-emitting layer 8R and the second light-emitting layer 8G may have an identical thickness d8. In this case, at the same mixture ratio of the second hole-transport-layer material, the first hole-transport layer 6R and the second hole-transport layer 6G can be formed simultaneously through co-evaporation as described above.

The thicknesses of the first hole-transport layer 6R and second hole-transport layer 6G do not have to be the same; the thicknesses may be different from each other. In addition, the mixture ratio of the second hole-transport-layer material may be different between the first hole-transport layer 6R and the second hole-transport layer 6G.

Based on a principle similar to that described above, this embodiment can reduce charge movement to the first light-emitting element 2R and the second light-emitting element 2G, through which current easily flows via the common hole-transport layer 6C, upon voltage application across the third light-emitting element 2B. That is, the display device 1 according to this embodiment can reduce crosstalk from the blue sub-pixel to the red and green sub-pixels.

Fourth Embodiment

Figure 6:
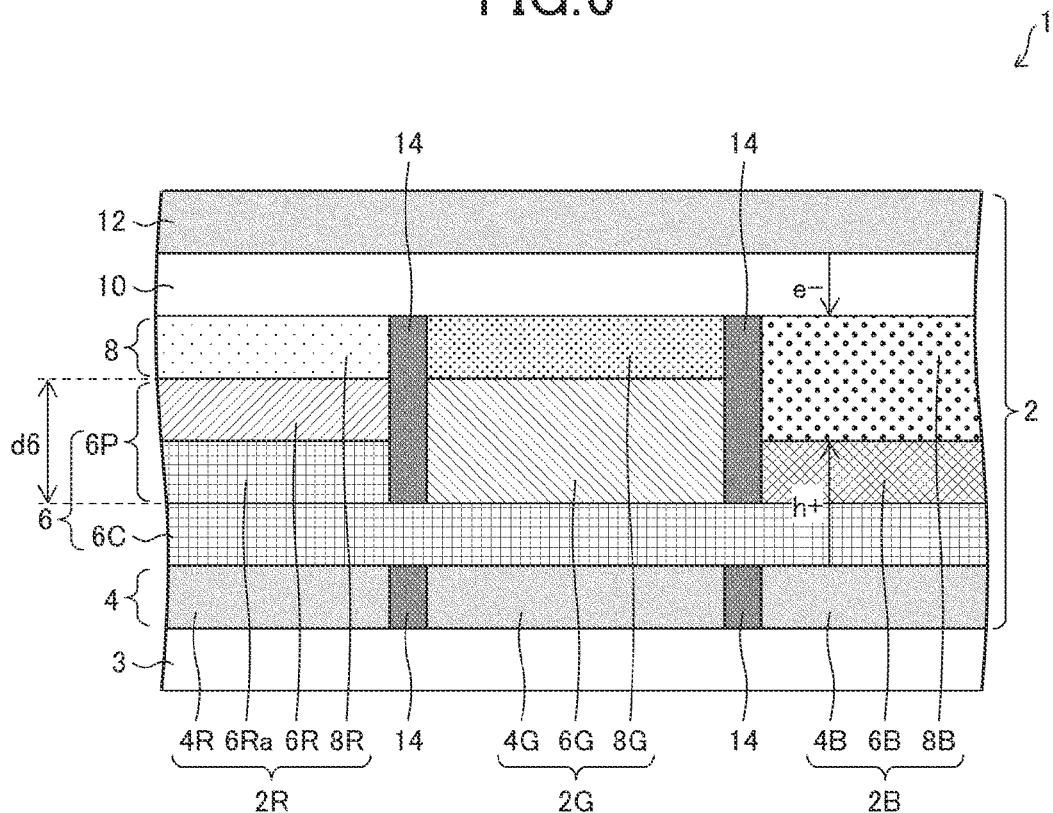
FIG. 6 is a schematic cross-sectional view of a display device according to a fourth embodiment of the disclosure.

FIG. 6 is a cross-sectional view of the display device 1 according to this embodiment and corresponds to FIG. 1(b). The display device 1 according to this embodiment has a configuration different from that of the display devices 1 according to the foregoing embodiments only in that the display device 1 further includes a fourth hole-transport layer 6Ra (fourth individual hole-transport layer) between the anode 4 and the first hole-transport layer 6R.

The fourth hole-transport layer 6Ra is in contact with and electrically connected to the common hole-transport layer 6C and the first hole-transport layer 6R. The fourth hole-transport layer 6Ra is formed using the first hole-transport-layer material, like the common hole-transport layer 6C. It is noted that the total thickness of the first hole-transport layer 6R and fourth hole-transport layer 6Ra may be the thickness d6, as illustrated in FIG. 6, which is the same as the thickness of the second hole-transport layer 6G.

This embodiment provides almost no barriers to hole transport from the common hole-transport layer 6C to the fourth hole-transport layer 6Ra. This embodiment thus can improve the efficiency of hole transport from the first anode 4R to the first light-emitting layer 8R in the first light-emitting element 2R while reducing crosstalk to the red sub-pixel.

The display device 1 according to each embodiment may be any display device that includes a display panel being flexible and having bendable display elements. Such display elements include a display element whose luminance and transmittance are regulated by current, and a display element whose luminance and transmittance are regulated by voltage.

The display device 1 according to each embodiment may include, for instance, organic light-emitting diodes (OLEDs) as display elements that are controlled by current. The display device 1 according to each embodiment in this case may be an organic electro-luminescence (EL) display.

Alternatively, the display device 1 according to each embodiment may include inorganic light-emitting diodes as display elements that are controlled by current. The display device 1 according to each embodiment in this case may be a quantum-dot light-emitting diode (QLED) display that includes EL display (e.g., inorganic EL display) QLEDs.

An example of the display element that is controlled by voltage is liquid-crystal display element.

Figure 7:
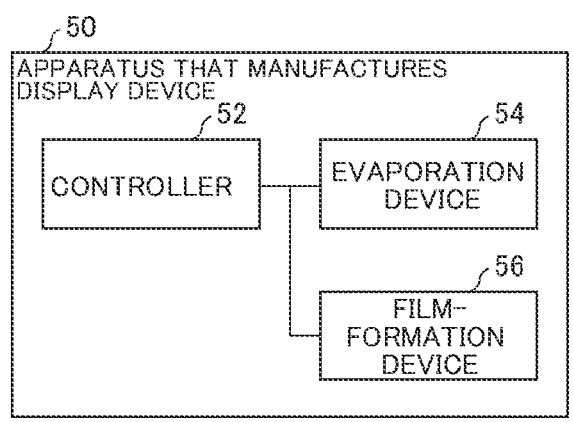
FIG. 7 is a block diagram of an apparatus that manufactures the display devices according to the embodiments of the disclosure.

FIG. 7 is a block diagram of an apparatus 50 that manufactures a display device and that is used in process steps for manufacturing the display device 1 according to each embodiment. The apparatus 50 that manufactures a display device includes a controller 52, an evaporation device 54, and a film-formation device 56. The controller 52 may control the evaporation device 54 and the film-formation device 56.

The evaporation device 54 may form, through evaporation, at least part of each layer of the display device 1 including the hole-transport layer 6. In each of the foregoing embodiments, the evaporation device 54 may form the individual hole-transport layer 6P, which is made of a mixed material of the first and second hole-transport-layer materials, through co-evaporation of the first and second hole-transport-layer materials. The film-formation device 56 may form each layer of the display device 1 not formed by the evaporation device 54.

SUMMARY

A first aspect provides a display device including the following: a plurality of sub-pixels that emit different colors of light from each other, and a stack of a light-emitting layer, an anode, and a cathode. The light-emitting layer is provided for each of the plurality of sub-pixels and emits a color of light corresponding to each of the plurality of sub-pixels. The anode is disposed on one side of the light-emitting layer. The cathode is disposed on another side of the light-emitting layer. The plurality of sub-pixels include, in common, a common hole-transport layer disposed between the anode and the light-emitting layer. Each of the plurality of sub-pixels individually includes an individual hole-transport layer disposed between the common hole-transport layer and the light-emitting layer. The common hole-transport layer is made of a first hole-transport-layer material. The plurality of sub-pixel include a sub-pixel having a first color and including a first individual hole-transport layer made of a second hole-transport-layer material different from the first hole-transport-layer material. The plurality of sub-pixel also include a sub-pixel having a second color and including a second individual hole-transport layer made of a mixed material of the first and second hole-transport-layer materials. The second color is different from the first color.

In a second aspect, the common hole-transport layer is made of only the first hole-transport-layer material, and the first individual hole-transport layer is made of only the second hole-transport-layer material.

In a third aspect, the first hole-transport-layer material has an energy level of the highest occupied molecular orbital whose absolute value is smaller than the absolute value of the energy level of the highest occupied molecular orbital of the second hole-transport-layer material.

In a fourth aspect, the first and second hole-transport-layer materials satisfy HOMO1+0.2 eV<HOMO2, where HOMO1 (eV) is the absolute value of the energy level of the highest occupied molecular orbital of the first hole-transport-layer material, where HOMO2 (eV) is the absolute value of the energy level of the highest occupied molecular orbital of the second hole-transport-layer material.

In a fifth aspect, the second individual hole-transport layer contains the second hole-transport-layer material at a mixture ratio of 10% or more and 50% or less of the whole.

In a sixth aspect, the first color is blue, and the second color is red.

In a seventh aspect, the first color is blue, and the second color is green.

In an eighth aspect, the plurality of sub-pixels further include a sub-pixel having a third color, and the third color is green.

In a ninth aspect, the plurality of sub-pixels further include a sub-pixel having a third color, and the third color is red.

In a tenth aspect, the sub-pixel having the third color includes a third individual hole-transport layer made of the first hole-transport-layer material.

In an eleventh aspect, the sub-pixel having the third color includes a third individual hole-transport layer made of the mixed material.

In a twelfth aspect, the third individual hole-transport layer contains the second hole-transport-layer material at a mixture ratio of 10% or more and 50% or less of the whole.

In a thirteenth aspect, the second and third individual hole-transport layers have an identical thickness.

In a fourteenth aspect, the sub-pixel having the second color further includes a fourth individual hole-transport layer disposed between the second individual hole-transport layer and the common hole-transport layer. The fourth individual hole-transport layer is made of the first hole-transport-layer material.

In a fifteenth aspect, the individual hole-transport layer made of the mixed material is in contact with the light-emitting layer.

A sixteenth aspect provides a method for manufacturing a display device. The display device includes the following: a plurality of sub-pixels that emit different colors of light from each other; and a stack of a light-emitting layer, an anode, and a cathode. The light-emitting layer is provided for each of the plurality of sub-pixels and emits a color of light corresponding to each of the plurality of sub-pixels. The anode is disposed on one side of the light-emitting layer. The cathode is disposed on another side of the light-emitting layer. The method includes a hole-transport-layer forming step of forming a common hole-transport layer between the anode and the light-emitting layer in such a manner that the plurality of sub-pixels include, in common, the common hole-transport layer, and of forming an individual hole-transport layer between the common hole-transport layer and the light-emitting layer in such a manner that each of the plurality of sub-pixels individually includes the individual hole-transport layer. The hole-transport-layer forming step includes the following: forming the common hole-transport layer through evaporation of a first hole-transport-layer material; and forming, through evaporation of a second hole-transport-layer material, a first individual hole-transport layer in a sub-pixel having a first color and included in the plurality of sub-pixels. The second hole-transport-layer material is different from the first hole-transport-layer material. The step also includes forming, through co-evaporation of the first and second hole-transport-layer materials, a second individual hole-transport layer in a sub-pixel having a second color and included in the plurality of sub-pixels. The second color is different from the first color.

A seventeenth aspect provides an apparatus that manufactures a display device. The display device includes the following: a plurality of sub-pixels that emit different colors of light from each other, and a stack of a light-emitting layer, an anode, and a cathode. The light-emitting layer is provided for each of the plurality of sub-pixels and emits a color of light corresponding to each of the plurality of sub-pixels. The anode is disposed on one side of the light-emitting layer. The cathode is disposed on another side of the light-emitting layer. The apparatus includes an evaporation device that forms a common hole-transport layer between the anode and the light-emitting layer in such a manner that the plurality of sub-pixels include, in common, the common hole-transport layer, and that forms an individual hole-transport layer between the common hole-transport layer and the light-emitting layer in such a manner that each of the plurality of sub-pixels individually includes the individual hole-transport layer. The evaporation device forms the common hole-transport layer through evaporation of a first hole-transport-layer material. The evaporation device also forms, through evaporation of a second hole-transport-layer material, a first individual hole-transport layer in a sub-pixel having a first color and included in the plurality of sub-pixels. The second hole-transport-layer material is different from the first hole-transport-layer material. The evaporation device also forms, through co-evaporation of the first and second hole-transport-layer materials, a second individual hole-transport layer in a sub-pixel having a second color and included in the plurality of sub-pixels. The second color is different from the first color.

The disclosure is not limited to the foregoing individual embodiments. Various modifications can be devised within the scope of the claims. An embodiment that is obtained in combination, as appropriate, with the technical means disclosed in the respective different embodiments is included in the technical scope of the disclosure. Furthermore, combining the technical means disclosed in the respective embodiments can provide a new technical feature.

REFERENCE SIGNS LIST 1 display device
2 light-emitting element layer
2R, G, B first to third light-emitting elements
4 anode
6 hole-transport layer
6C common hole-transport layer
6P individual hole-transport layer
6R, G, B first to third hole-transport layers
6Ra fourth hole-transport layer
8 light-emitting layer
8R, G, B first to third light-emitting layers
12 cathode
50 apparatus that manufactures a display device

The invention claimed is:

1. A display device comprising:
a plurality of sub-pixels configured to emit different colors of light from each other; and
a stack of a light-emitting layer, an anode, and a cathode, the light-emitting layer being provided for each of the plurality of sub-pixels and configured to emit a color of light corresponding to each of the plurality of sub-pixels, the anode being disposed on one side of the light-emitting layer, the cathode being disposed on another side of the light-emitting layer,
wherein the plurality of sub-pixels includes, in common, a common hole-transport layer disposed between the anode and the light-emitting layer,
each of the plurality of sub-pixels individually includes an individual hole-transport layer disposed between the common hole-transport layer and the light-emitting layer,
the common hole-transport layer is made of a first hole-transport-layer material, and
the plurality of sub-pixels further includes:
a sub-pixel having a first color and including a first individual hole-transport layer made of a second hole-transport-layer material different from the first hole-transport-layer material,
a sub-pixel having a second color and including a second individual hole-transport layer made of a mixed material of the first and second hole-transport-layer materials, the second color being different from the first color, and
a sub-pixel having a third color and including a third individual hole-transport layer made of the first hole-transport-layer material,
wherein a hole mobility of the first hole-transport-layer material is higher than a hole mobility of the second hole-transport-layer material,
the third individual hole-transport layer is separated from the first individual hole-transport layer and the second individual hole-transport layer,
the common hole-transport layer is shared by the sub-pixel having the first color, the sub-pixel having the second color, and the sub-pixel having the third color,
the third individual hole-transport layer is a different layer from the common hole-transport layer, and
the sub-pixel having the second color further includes a fourth individual hole-transport layer disposed between the second individual hole-transport layer and the common hole-transport layer, the fourth individual hole-transport layer being made of the first hole-transport-layer material.

2. The display device according to claim 1, wherein
the common hole-transport layer is made of only the first hole-transport-layer material, and
the first individual hole-transport layer is made of only the second hole-transport-layer material.

3. The display device according to claim 1, wherein the first hole-transport-layer material has an energy level of a highest occupied molecular orbital an absolute value of which is smaller than an absolute value of an energy level of a highest occupied molecular orbital of the second hole-transport-layer material.

4. The display device according to claim 3, wherein
the first and second hole-transport-layer materials satisfy HOMO1+0.2 eV<HOMO2, where HOMO1 (eV) is the absolute value of the energy level of the highest occupied molecular orbital of the first hole-transport-layer material, and HOMO2 (eV) is the absolute value of the energy level of the highest occupied molecular orbital of the second hole-transport-layer material.

5. The display device according to claim 1, wherein the second individual hole-transport layer contains the second hole-transport-layer material at a mixture ratio of 10% or more and 50% or less of a whole.

6. The display device according to claim 1, wherein the first color is blue, and the second color is red.

7. The display device according to claim 1, wherein the first color is blue, and the second color is green.

8. The display device according to claim 6, wherein
the third color is green.

9. The display device according to claim 7, wherein
the third color is red.

10. The display device according to claim 1, wherein the second and third individual hole-transport layers have an identical thickness.

11. The display device according to claim 1, wherein the individual hole-transport layer made of the mixed material is in contact with the light-emitting layer.

12. A method for manufacturing a display device, comprising:
forming a light-emitting layer being provided for each of a plurality of sub-pixels configured to emit different colors of light, corresponding to each of the plurality of sub-pixels, from each other;

forming each of an anode and a cathode, the anode being disposed on one side of the light-emitting layer, the cathode being disposed on another side of the light-emitting layer;

forming a common hole-transport layer between the anode and the light-emitting layer in such a manner that the plurality of sub-pixels includes, in common, the common hole-transport layer; and forming an individual hole-transport layer between the common hole-transport layer and the light-emitting layer in such a manner that each of the plurality of sub-pixels individually includes the individual hole-transport layer, wherein forming the common hole-transport layer and forming the individual hole-transport layer further includes:

forming the common hole-transport layer through evaporation of a first hole-transport-layer material, forming, through evaporation of a second hole-transport-layer material, a first individual hole-transport layer in a sub-pixel of the plurality of sub-pixels having a first color, the second hole-transport-layer material being different from the first hole-transport-layer material, forming, through co-evaporation of the first and second hole-transport-layer materials, a second individual hole-transport layer in a sub-pixel of the plurality of sub-pixels having a second color, the second color being different from the first color, forming, through evaporation of the first hole-transport-layer material, a third individual hole-transport layer in a sub-pixel of the plurality of sub-pixels having a third color as a layer being different from the common hole transport layer, the third color being different from the first color and the second color, and forming, through evaporation of the first hole-transport-layer material, a fourth individual hole-transport layer, disposed between the second individual hole-transport layer and the common hole-transport layer, in the sub-pixel of the plurality of sub-pixels having the second color, wherein a hole mobility of the first hole-transport-layer material is higher than a hole mobility of the second hole-transport-layer material.

* * * * *